US011506976B2

(12) United States Patent
Nakagawa et al.

(10) Patent No.: US 11,506,976 B2
(45) Date of Patent: *Nov. 22, 2022

(54) RADIATION-SENSITIVE COMPOSITION AND RESIST PATTERN-FORMING METHOD

(71) Applicant: JSR CORPORATION, Tokyo (JP)

(72) Inventors: Hisashi Nakagawa, Tokyo (JP); Yusuke Asano, Tokyo (JP); Shinya Minegishi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 330 days.

This patent is subject to a terminal disclaimer.

(21) Appl. No.: 16/778,166

(22) Filed: Jan. 31, 2020

(65) Prior Publication Data

US 2020/0166840 A1    May 28, 2020

Related U.S. Application Data

(63) Continuation of application No. PCT/JP2018/027972, filed on Jul. 25, 2018.

(30) Foreign Application Priority Data

Aug. 10, 2017  (JP) .............................. JP2017-156126

(51) Int. Cl.
    *G03F 7/004*    (2006.01)
    *G03F 7/038*    (2006.01)
    *C08G 79/00*    (2006.01)
    *C08G 79/12*    (2006.01)
    *G03F 7/16*     (2006.01)
    *G03F 7/20*     (2006.01)
    *G03F 7/30*     (2006.01)
    *G03F 7/38*     (2006.01)

(52) U.S. Cl.
    CPC ............ *G03F 7/038* (2013.01); *C08G 79/00* (2013.01); *C08G 79/12* (2013.01); *G03F 7/0045* (2013.01); *G03F 7/162* (2013.01); *G03F 7/168* (2013.01); *G03F 7/2002* (2013.01); *G03F 7/30* (2013.01); *G03F 7/38* (2013.01)

(58) Field of Classification Search
    CPC .... G03F 7/0042; G03F 7/0043; G03F 7/0045; G03F 7/038
    See application file for complete search history.

(56) References Cited

U.S. PATENT DOCUMENTS 11,079,676 B2 *  8/2021  Asano .................... G03F 7/325

FOREIGN PATENT DOCUMENTS

| EP | 3 564 752 A1 | 11/2019 | |
|---|---|---|---|
| EP | 3 575 872 A1 | 12/2019 | |
| JP | 8-146610 A | 6/1996 | |
| JP | 11-125907 A | 5/1999 | |
| JP | 2000-298347 A | 10/2000 | |
| JP | 2003-215792 A | 7/2003 | |
| WO | WO2016/140057 | * 9/2016 | ............. G03F 7/004 |

OTHER PUBLICATIONS

Machine English Translation of WO2016/140057 (Year: 2016).*
Extended European Search Report dated Apr. 12, 2021 in European Patent Application No. 18845007.6, citing documents AO through AQ therein, 8 pages.
International Search Report dated Sep. 18, 2018 in PCT/JP2018/027972 (with English translation), 4 pages.
Written Opinion of the International Searching Authority dated Sep. 18, 2018 in PCT/JP2018/027972 (with English translation), 7 pages.

* cited by examiner

*Primary Examiner* — Daborah Chacko-Davis
(74) *Attorney, Agent, or Firm* — Oblon, McClelland, Maier & Neustadt, L.L.P.

(57) ABSTRACT

A radiation-sensitive composition contains: a polymetalloxane including a structural unit represented by formula (1); a radiation-sensitive acid generator; and a solvent. In the following formula (1), M represents a germanium atom, a tin atom or a lead atom; $Ar^1$ represents a substituted or unsubstituted aryl group having 6 to 20 ring atoms or a substituted or unsubstituted heteroaryl group having 5 to 20 ring atoms; $R^1$ represents a monovalent organic group having 1 to 20 carbon atoms, a hydrogen atom, a halogen atom or a hydroxy group; and n is 2 or 3.

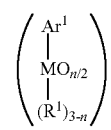

(1)

20 Claims, No Drawings

RADIATION-SENSITIVE COMPOSITION AND RESIST PATTERN-FORMING METHOD

CROSS-REFERENCE TO RELATED APPLICATIONS

The present application is a continuation application of International Application No. PCT/JP2018/027972, filed Jul. 25, 2018, which claims priority to Japanese Patent Application No. 2017-156126, filed Aug. 10, 2017. The contents of these applications are incorporated herein by reference in their entirety.

BACKGROUND OF THE INVENTION

Field of the Invention

The present invention relates to a radiation-sensitive composition and a resist pattern-forming method.

Description of the Related Art

Radiation-sensitive compositions for use in microfabrication by lithography generate acids at light-exposed regions by exposure to electromagnetic waves such as a far ultraviolet ray (an ArF excimer laser beam, a KrF excimer laser beam, etc.) or an extreme ultraviolet ray (EUV ray), charged particle rays such as an electron beam, or the like. A chemical reaction in which the acid serves as a catalyst causes a difference in rates of dissolution between light-exposed regions and light-unexposed regions, in a developer solution, thereby enabling a resist pattern to be formed on a substrate.

There is a demand for such radiation-sensitive compositions to allow for improved resist performance along with microfabrication in processing techniques.

To meet this demand, types, molecular structures and the like of polymers, acid generating agents and other components which may be used in the compositions have been investigated, and combinations thereof have been further investigated in detail (see, Japanese Unexamined Patent Application, Publication Nos. H11-125907, H8-146610 and 2000-298347).

SUMMARY OF THE INVENTION

At present, miniaturization of patterns has proceeded to a level of no greater than 40 nm in terms of the line width, and therefore there has been a demand for further improvements of various types of resist performance for radiation-sensitive compositions. In addition to enabling superior sensitivity to be achieved even in cases of being exposed to, in particular, electron beams, EUV, etc., an ability to further enhance a resolution of the resist pattern to be formed has also been desired. However, the aforementioned conventional radiation-sensitive compositions have not been able to meet these demands.

According to an aspect of the present invention, a radiation-sensitive composition contains: a polymetalloxane including a structural unit represented by formula (1); a radiation-sensitive acid generator; and a solvent. In the following formula (1), M represents a germanium atom, a tin atom or a lead atom; $Ar^1$ represents a substituted or unsubstituted aryl group having 6 to 20 ring atoms or a substituted or unsubstituted heteroaryl group having 5 to 20 ring atoms; $R^1$ represents a monovalent organic group having 1 to 20 carbon atoms, a hydrogen atom, a halogen atom or a hydroxy group; and n is 2 or 3.

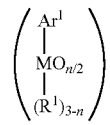
(1)

According to another aspect of the present invention, a resist pattern-forming method includes applying the radiation-sensitive composition directly or indirectly on at least one face side of a substrate to form a resist film. The resist film is exposed to an extreme ultraviolet ray or electron beam. The resist film exposed is developed with an organic solvent-containing liquid.

DESCRIPTION OF THE EMBODIMENTS

According to one embodiment of the invention, a radiation-sensitive composition comprises: a polymetalloxane (hereinafter, may be also referred to as "(A) polymetalloxane" or "polymetalloxane (A)") having a structural unit represented by the following formula (1) (hereinafter, may be also referred to as "structural unit (I)"); a radiation-sensitive acid generator (hereinafter, may be also referred to as "(B) acid as generator" or "acid generator (B)"); and a solvent (hereinafter, may be also referred to as "(C) solvent" or "solvent (C)"),

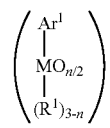
(1)

wherein, in the formula (1), M represents a germanium atom, a tin atom or a lead atom; $Ar^1$ represents a substituted or unsubstituted aryl group having 6 to 20 ring atoms or a substituted or unsubstituted heteroaryl group having 5 to 20 ring atoms; $R^1$ represents a monovalent organic group having 1 to 20 carbon atoms, a hydrogen atom, a halogen atom or a hydroxy group; and n is 2 or 3.

According to another embodiment of the present invention made for solving the aforementioned problems, a resist pattern-forming method comprises: applying the radiation-sensitive composition of the one embodiment of the present invention directly or indirectly on at least an upper face side of a substrate to form a resist film; exposing the resist film to an extreme ultraviolet ray or an electron beam; and developing with an organic solvent-containing liquid the resist film exposed.

The radiation-sensitive resin composition of the one embodiment of the present invention is capable of forming a resist pattern with superior sensitivity and superior resolution. Therefore, the radiation-sensitive resin composition and the resist pattern-forming method of the embodiments of the present invention can be suitably used for manufacture of semiconductor devices, in which microfabrication is expected to progress further hereafter.

Radiation-Sensitive Composition

A radiation-sensitive composition of one embodiment of the present invention contains the polymetalloxane (A), the acid generator (B), and the solvent (C). The radiation-sensitive composition may also contain, as a favorable component, an acid trapper (hereinafter, may be also referred to as "(D) acid trapper" or "acid trapper (D)"), and may further contain, within a range not leading to impairment of the effects of the present invention, other optional component(s).

The radiation-sensitive composition is superior in sensitivity and resolution due to containing the polymetalloxane (A) and the acid generator (B). Although not necessarily clarified and without wishing to be bound by any theory, the reason for achieving the effects described above due to the radiation-sensitive composition having the constitution described above may be supposed as in the following, for example. The polymetalloxane (A) has a metal atom of germanium, tin or lead respectively, and a (hetero)aromatic ring bonds to this metal atom. In this polymetalloxane (A), bonds between the metal and the (hetero)aromatic rings ([metal]-[(hetero)aromatic ring]) are cleaved by an action of an acid generated from the acid generator (B) upon the exposure to generate bonds of [metal]-(OH), which are condensed to increase a molecular weight, whereby the resist pattern is considered to be formed. Such resist pattern formation from the polymetalloxane (A) by the acid generator (B) can be performed with superior sensitivity, and therefore formation of the resist pattern is believed to be enabled with superior resolution. Hereinafter, each component will be described.

(A) Polymetalloxane

The polymetalloxane (A) has the structural unit (I). The "polymetalloxane" as referred to herein means a compound having at least one bond of [metal]-[oxygen]-[metal]. The polymetalloxane (A) may also have, in addition to the structural unit (I), a structural unit (II) represented by a formula (2) and a structural unit (III) represented by a formula (3), which are described later, and the like. Hereinafter, each structural unit will be described.

Structural Unit (I)

The structural unit (I) is represented by the following formula (I).

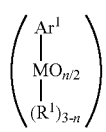

(1)

In the above formula (1), M represents a germanium atom, a tin atom or a lead atom; $Ar^1$ represents a substituted or unsubstituted aryl group having 6 to 20 ring atoms or a substituted or unsubstituted heteroaryl group having 5 to 20 ring atoms; $R^1$ represents a monovalent organic group having 1 to 20 carbon atoms, a hydrogen atom, a halogen atom or a hydroxy group; and n is 2 or 3.

M represents preferably a tin atom in light of the sensitivity and resolution each being superior.

Examples of the aryl group having 6 to 20 ring atoms which may be represented by $Ar^1$ include a phenyl group, a naphthyl group, an anthryl group, a phenanthryl group, a fluorenyl group, a tetracenyl group, a pyrenyl group, and the like. Of these, a phenyl group or a naphthyl group are preferred, and a phenyl group is more preferred.

Examples of the heteroaryl group having 5 to 20 ring atoms which may be represented by $Ar^1$ include:

oxygen-containing aromatic heterocyclic groups such as a furyl group, a pyranyl group and a benzofuranyl group;

nitrogen-containing aromatic heterocyclic groups such as a pyrrolyl group, a pyridyl group and a quinolyl group;

sulfur-containing aromatic heterocyclic groups such as a thienyl group and a benzothiophenyl group; and the like. Of these, the oxygen-containing aromatic heterocyclic group is preferred, and a furyl group is more preferred.

Examples of the substituent of the substituted aryl group or the substituted heteroaryl group which may be represented by $Ar^1$ include:

electron donating groups such as a hydroxy group, an alkoxy group, an amino group, a cycloalkyloxy group, an alkyl group, and a cycloalkyl group;

halogen atoms such as a fluorine atom, a chlorine atom, a bromine atom, and an iodine atom;

electron attractive groups such as a cyano group, a nitro group, and a carboxy group; and the like.

In light of cleavage of the bond between the metal and the (hetero)aromatic rings of ([metal]-[(hetero)aromatic ring]) in the structural unit (I) being more likely to occur, the substituent is preferably the electron donating group, more preferably the alkoxy group, and still more preferably a methoxy group.

The monovalent organic group having 1 to 20 carbon atoms which may be represented by $R^1$ is exemplified by: a monovalent hydrocarbon group having 1 to 20 carbon atoms; a group (a) that includes a divalent hetero atom-containing group between carbon atoms of ([carbon]-[carbon]) of the monovalent hydrocarbon group having 1 to 20 carbon atoms; a group obtained by substituting, with a monovalent hetero atom-containing group, a part or all of hydrogen atoms included in the monovalent hydrocarbon group having 1 to 20 carbon atoms or in the group (a); and the like. Alternatively, the monovalent organic group having 1 to 20 carbon atoms which may be represented by $R^1$ may be, similarly to $Ar^1$, a substituted or unsubstituted aryl group having 6 to 20 ring atoms or a substituted or unsubstituted heteroaryl group having 5 to 20 ring atoms.

As referred to herein, the "hydrocarbon group" may involve a chain hydrocarbon group, an alicyclic hydrocarbon group and an aromatic hydrocarbon group. The "hydrocarbon group" may be either a saturated hydrocarbon group or an unsaturated hydrocarbon group. The "chain hydrocarbon group" as referred to herein means a hydrocarbon group not including a ring structure but comprising only a chain structure, and both a straight chain hydrocarbon group and a branched hydrocarbon group are involved. The "alicyclic hydrocarbon group" as referred to herein means a hydrocarbon group not including an aromatic ring structure but comprising only an alicyclic structure as the ring structure, and both a monocyclic alicyclic hydrocarbon group and a polycyclic alicyclic hydrocarbon group are involved. However, the alicyclic hydrocarbon group does not need to be constituted by only the alicyclic structure, and a part thereof may include a chain structure. The "aromatic hydrocarbon group" as referred to herein means a hydrocarbon group including an aromatic ring structure as the ring structure. However, the aromatic hydrocarbon group does not need to be constituted by only the aromatic ring structure, and a part thereof may include a chain structure and/or an alicyclic structure.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms include:

monocyclic alicyclic saturated hydrocarbon groups such as a cyclopentyl group and a cyclohexyl group;

monocyclic alicyclic unsaturated hydrocarbon groups such as a cyclopentenyl group and a cyclohexenyl group;

polycyclic alicyclic saturated hydrocarbon groups such as a norbornyl group, an adamantyl group and a tricyclodecyl group;

polycyclic alicyclic unsaturated hydrocarbon groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group and an anthryl group;

aralkyl groups such as a benzyl group, a phenethyl group, a naphthylmethyl group and an anthrylmethyl group; and the like.

The hetero atom that may constitute the monovalent or divalent hetero atom-containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent hetero atom-containing group include —O—, —CO—, —S—, —CS—, —NR'—, groups obtained by combining at least two of the same, and the like, wherein R' represents a hydrogen atom or a monovalent hydrocarbon group. Of these, —O— is preferred.

Examples of the monovalent hetero atom-containing group include halogen atoms such as a fluorine atom, a chlorine atom, a bromine atom and an iodine atom, a hydroxy group, a carboxy group, a cyano group, an amino group, a sulfanyl group (—SH), a sulfonate group (—SO$_3^-$X$^+$, wherein X$^+$ represents a monovalent cation), a sulfonium salt group (—Y$^+$T$^-$, wherein —Y$^+$ represents a monovalent sulfonium cation group, and T represents a monovalent anion), and the like. Of these, a fluorine atom is preferred.

R$^1$ represents preferably a hydroxy group.

In the above formula (1), n is preferably 3.

The lower limit of the proportion of the structural unit (I) contained with respect to the total structural units constituting the polymetalloxane (A) is preferably 5 mol %, more preferably 20 mol %, still more preferably 50 mol %, and particularly preferably 75 mol %. The upper limit of the proportion of the structural unit (I) is preferably 100 mol %, more preferably 99 mol %, still more preferably 95 mol %, and particularly preferably 90 mol %. When the proportion of the structural unit (I) falls within the above range, the sensitivity and resolution of the radiation-sensitive composition can be further improved.

Structural Unit (II)

The structural unit (II) is represented by the following formula (2).

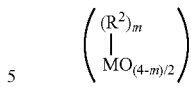

$$\begin{pmatrix} (R^2)_m \\ | \\ MO_{(4-m)/2} \end{pmatrix} \qquad (2)$$

In the above formula (2), M represents a germanium atom, a tin atom or a lead atom; R$^2$ represents a substituted or unsubstituted chain hydrocarbon group having 1 to 20 carbon atoms, a substituted or unsubstituted alicyclic hydrocarbon group having 3 to 20 carbon atoms, or a substituted or unsubstituted aralkyl group having 7 to 20 carbon atoms; and m is an integer of 1 or 2, wherein in a case in which m is 2, two R$^2$s are identical or different.

Examples of the chain hydrocarbon group, the alicyclic hydrocarbon group or the aralkyl group which may be represented by R$^2$ include groups similar to those exemplified as the chain hydrocarbon group, the alicyclic hydrocarbon group or the aralkyl group for the organic group which may be represented by R$^1$ described above, and the like. Examples of the substituent which may be included in the chain hydrocarbon group, the alicyclic hydrocarbon group or the aralkyl group which may be represented by R$^2$ include groups similar to the monovalent hetero atom-containing groups exemplified as the substituent in the organic group which may be represented by R$^1$ described above, and the like.

In the above formula (2), m is preferably 1.

In a case in which the polymetalloxane (A) contains the structural unit (II), the lower limit of the content of the structural unit (II) is preferably 1 mol %, more preferably 5 mol %, still more preferably 10 mol %, and particularly preferably 15 mol %. The upper limit of the content of the structural unit (II) is preferably 50 mol %, more preferably 30 mol %, still more preferably 25 mol %, and particularly preferably 20 mol %.

Structural Unit (III)

The structural unit (III) is represented by the following formula (3).

$$(MO_2) \qquad (3)$$

In the above formula (3), M represents a germanium atom, a tin atom or a lead atom.

In a case in which the polymetalloxane (A) has the structural unit (III), the lower limit of the proportion of the structural unit (III) contained with respect to the total structural units constituting the polymetalloxane (A) is preferably 1 mol %, more preferably 3 mol %, still more preferably 5 mol %, and particularly preferably 10 mol %. The upper limit of the proportion of the structural unit (III) is preferably 50 mol %, more preferably 30 mol %, still more preferably 20 mol %, and particularly preferably 15 mol %.

Other Structural Unit

The polymetalloxane (A) may have a structural unit (other structural unit(s)) other than the structural units (I) to (III). The other structural unit is exemplified by a structural unit that includes a metal atom or a metalloid atom such as a transition metal atom or an atom belonging to group 13 or group 15, and the like. In a case in which the polymetalloxane (A) has the other structural unit, the lower limit of the content of the other structural unit with respect to the total structural units constituting the polymetalloxane (A) is preferably 1 mol %, and more preferably 3 mol %. The upper limit of the content of the other structural unit is preferably 50 mol %, and more preferably 20 mol %.

The lower limit of the content of the polymetalloxane (A) with respect to the total solid content in the radiation-sensitive composition is preferably 50% by mass, more preferably 70 mol %, still more preferably 80 mol %, and particularly preferably 85% by mass. The upper limit of the content is, for example, 95% by mass. The "total solid content" as referred to herein means a value calculated from a mass (W1) of the radiation-sensitive composition, and a mass (W2) determined after drying of this composition, according to a formula of: W2×100/W1 (% by mass). The radiation-sensitive composition may contain two or more types of the polymetalloxane (A).

The lower limit of a weight average molecular weight (Mw) of the polymetalloxane (A) is preferably 700, more preferably 1,000, still more preferably 1,200, and particularly preferably 1,400. The upper limit of the Mw is preferably 20,000, more preferably 10,000, still more preferably 8,000, and particularly preferably 7,000. When the Mw of the polymetalloxane (A) falls within the above range, the sensitivity and the resolution can be further improved.

The Mw of the polymetalloxane (A) as referred to herein is a value determined using gel permeation chromatography (GPC) under the following conditions.

GPC columns: "Super AWM-H"×2 and "Super AW2500"×2, both available from Tosoh Corporation
  column temperature: 40° C.
  elution solvent: 30 mM LiBr solution in N,N-dimethylacetamide
  flow rate: 0.3 mL/min
  sample concentration: 1.0% by mass
  amount of injected sample: 100 μL
  detector: differential refractometer
  standard substance: mono-dispersed polystyrene Synthesis Procedure of Polymetalloxane (A)

The polymetalloxane (A) can be synthesized by, for example, performing a hydrolytic condensation of a metal halide that gives the structural unit (I), with a metal compound or the like having a phenylethynyl group in a solvent such as tetrahydrofuran, in the presence of water.

(B) Acid Generator

The acid generator (B) is a component that generates an acid (hereinafter, may be also referred to as "acid (I)") by irradiation with a radioactive ray. The acid generator (B) may be contained in the radiation-sensitive composition in the form of a low-molecular-weight compound (hereinafter, may be also referred to as "(B) acid generating agent" or "acid generating agent (B)" as appropriate), in the form of an acid generator incorporated as a part of the polymetalloxane (A), or in a combination of both these forms. In the case in which the acid generator (B) is in the form incorporated as a part of the polymetalloxane (A), the radiation-sensitive composition contains: a polymetalloxane having the structural unit represented by the above formula (1) and having a site that that is capable of generating an acid by irradiation with a radioactive ray; and the solvent (C).

The upper limit of a pKa of the acid (I) is preferably 3, more preferably 1, still more preferably 0, and particularly preferably −1. The lower limit of the pKa is preferably −5, more preferably −4, still more preferably −3, and particularly preferably −2. When the pKa of the acid (I) falls within the above range, a rate of an increase in the molecular weight of the polymetalloxane (A) by way of an action of the acid (I) can be made more appropriate and as a result, the sensitivity and resolution of the radiation-sensitive composition can be further improved.

Examples of the acid (I) include sulfonic acid, disulfonylimidic acid, and the like.

Examples of the acid generating agent (B) that generates sulfonic acid include a sulfonate onium salt represented by the following formula (4), and the like.

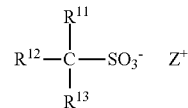

In the above formula (4), $R^{11}$, $R^{12}$ and $R^{13}$ each independently represent a hydrogen atom, a fluorine atom or a monovalent organic group having 1 to 20 carbon atoms; and $Z^+$ represents a monovalent radiation-sensitive onium cation.

Examples of the monovalent organic group having 1 to 20 carbon atoms which may be represented by $R^{11}$, $R^{12}$ or $R^{13}$ include groups similar to those exemplified as the organic group which may be represented by $R^1$ described above, and the like.

With respect to a combination of $R^{11}$ to $R^{13}$, for example: a combination of $R^{11}$ and $R^{12}$ representing a fluorine atom with $R^{13}$ representing a perfluoroalkyl group; $R^{11}$ and $R^{12}$ representing a monovalent organic group not including a fluorine atom with $R^{13}$ representing a hydrogen atom; and the like may be exemplified.

Examples of the monovalent radiation-sensitive onium cation represented by $Z^+$ include a cation represented by the following formula (r-a) (hereinafter, may be also referred to as "cation (r-a)"), a cation represented by the following formula (r-b) (hereinafter, may be also referred to as "cation (r-b)"), a cation represented by the following formula (r-c) (hereinafter, may be also referred to as "cation (r-c)"), and the like.

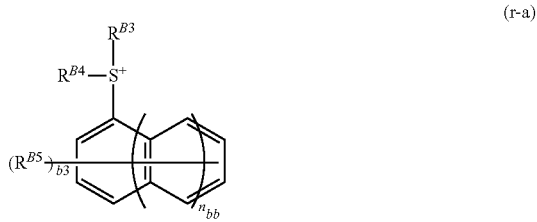

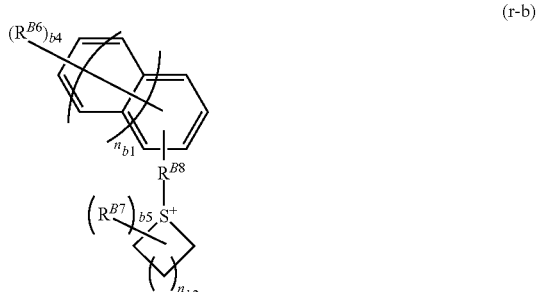

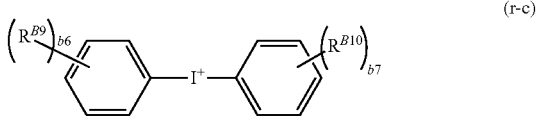

In the above formula (r-a), $R^{B3}$ and $R^{B4}$ each independently represent a monovalent organic group having 1 to 20 carbon atoms; $R^{B5}$ represents a monovalent organic group having 1 to 20 carbon atoms, a hydroxy group, a nitro group or a halogen atom, or two or more of $R^{B5}$s taken together represent a part of a ring structure together with the carbon chain to which the two or more of $R^{B5}$s bond; b3 is an integer of 0 to 5, wherein in a case in which a plurality of $R^{B5}$s are present, the plurality of $R^{B5}$s are identical or different; and $n_{bb}$ is an integer of 0 to 3.

Examples of the monovalent organic group having 1 to 20 carbon atoms which may be represented by $R^{B3}$, $R^{B4}$ or $R^{B5}$ include groups similar to the organic groups exemplified as $R^1$ in the above formula (1), and the like.

$R^{B3}$ and $R^{B4}$ each represent preferably a monovalent unsubstituted hydrocarbon group having 1 to 20 carbon atoms or a hydrocarbon group in which a hydrogen atom is to substituted with a substituent, more preferably a monovalent unsubstituted aromatic hydrocarbon group having 6 to 18 carbon atoms or an aromatic hydrocarbon group in which a hydrogen atom is substituted with a substituent, and still more preferably a phenyl group.

The substituent which may substitute for a hydrogen atom included in the monovalent hydrocarbon group having 1 to 20 carbon atoms represented by $R^{B3}$ or $R^{B4}$ is preferably a substituted or unsubstituted monovalent hydrocarbon group having 1 to 20 carbon atoms, —OSO$_2$—$R^k$, —SO$_2$—$R^k$, —O$R^k$, —COO$R^k$, —O—CO—$R^k$, —O—$R^{kk}$—COO$R^k$, —$R^{kk}$—CO—$R^k$ or —S—$R^k$, wherein $R^k$ represents a monovalent hydrocarbon group having 1 to 10 carbon atoms, and $R^{kk}$ represents a single bond or a divalent hydrocarbon group having 1 to 10 carbon atoms.

$R^{B5}$ represents preferably a substituted or unsubstituted monovalent hydrocarbon group having 1 to 20 carbon atoms, —OSO$_2$—$R^k$, —SO$_2$—$R^k$, —O$R^k$, —COO$R^k$—O—CO—$R^k$, —O—$R^{kk}$—COO$R^k$, —$R^{kk}$—CO—$R^k$ or —S—$R^k$, wherein $R^k$ represents a monovalent hydrocarbon group having 1 to 10 carbon atoms, and $R^k$ represents a single bond or a divalent hydrocarbon group having 1 to 10 carbon atoms.

In the above formula (r-b), $R^{B6}$ and $R^{B7}$ each independently represent a monovalent organic group having 1 to 20 carbon atoms, a hydroxy group, a nitro group or a halogen atom, or two or more of $R^{B6}$s taken together represent a part of a ring structure together with the carbon chain to which the two or more of $R^{B6}$s bond, or two or more of $R^{B7}$s taken together represent a part of a ring structure together with the carbon atom or carbon chain to which the two or more of $R^{B7}$s bond; b4 is an integer of 0 to 7, wherein in a case in which a plurality of $R^{B6}$s are present, the plurality of $R^{B6}$s are identical or different; b5 is an integer of 0 to 6, wherein in a case in which a plurality of $R^{B7}$s are present, the plurality of $R^{B7}$s are identical or different; $n_{b2}$ is an integer of 0 to 3; $R^{B8}$ represents a single bond or a divalent organic group having 1 to 20 carbon atoms; and $n_{b1}$ is an integer of 0 to 2.

$R^{B6}$ and $R^{B7}$ each represent preferably a substituted or unsubstituted monovalent hydrocarbon group having 1 to 20 carbon atoms, —O$R^k$, —COO$R^k$, —O—CO—$R^k$, —O—$R^{kk}$—COO$R^k$ or —$R^{kk}$—CO—$R^k$, wherein $R^k$ represents a monovalent hydrocarbon group having 1 to 10 carbon atoms, and $R^{kk}$ represents a single bond or a divalent hydrocarbon group having 1 to 10 carbon atoms.

In the above formula (r-c), $R^{B9}$ and $R^{B10}$ each independently represent a monovalent organic group having 1 to 20 carbon atoms, a hydroxy group, a nitro group or a halogen atom, or two or more of $R^{B9}$s taken together represent a part of a ring structure together with the carbon chain to which the two or more of $R^{B9}$s bond, or two or more of $R^{B10}$s taken together represent a part of a ring structure together with the carbon chain to which the two or more of $R^{B10}$s bond; and b6 and b7 are each independently an integer of 0 to 5, wherein in a case in which a plurality of $R^{B9}$s are present, the plurality of $R^{B9}$s are identical or different, and in a case in which a plurality of $R^{B10}$s are present, the plurality of $R^{B10}$s are identical or different.

It is preferred that $R^{B9}$ and $R^{B10}$ each represent a substituted or unsubstituted monovalent hydrocarbon group having 1 to 20 carbon atoms, —OSO$_2$—$R^k$, —SO$_2$—$R^k$, —O$R^k$, —COO$R^k$, —O—CO—$R^k$, —O—$R^{kk}$—COO$R^k$, —$R^{kk}$—CO—$R^k$ or —S—$R^k$, or that two or more of $R^{B9}$ and $R^{B10}$ taken together represent a part of a ring structure together with the carbon chain to which the two or more of $R^{B9}$ and $R^{B10}$ bond, wherein $R^k$ represents a monovalent hydrocarbon group having 1 to 10 carbon atoms; and $R^{kk}$ represents a single bond or a divalent hydrocarbon group having 1 to 10 carbon atoms.

Examples of the monovalent hydrocarbon group having 1 to 20 carbon atoms which may be represented by $R^{B5}$, $R^{B6}$, $R^{B7}$, $R^{B9}$ or $R^{B10}$ include groups similar to the groups exemplified as the hydrocarbon group for the organic group which may be represented by $R^1$ in the above formula (1), and the like.

Examples of the divalent organic group which may be represented by $R^{B8}$ include groups obtained by removing one hydrogen atom from the monovalent organic group having 1 to 20 carbon atoms exemplified as $R^1$ in the above formula (1), and the like.

Examples of the substituent which may substitute for a hydrogen atom included in the hydrocarbon group which may be represented by $R^{B5}$, $R^{B6}$, $R^{B7}$, $R^{B9}$ or $R^{B10}$ described above include: halogen atoms such as a fluorine atom, a chlorine atom, a bromine atom and an iodine atom; a hydroxy group; a carboxy group; a cyano group; a nitro group; an alkoxy group; an alkoxycarbonyl group; an alkoxycarbonyloxy group; an acyl group; an acyloxy group; and the like. Of these, a halogen atom is preferred and a fluorine atom is more preferred.

$R^{B5}$, $R^{B6}$, $R^{B7}$, $R^{B9}$ and $R^{B10}$ each represent preferably an unsubstituted linear or branched monovalent alkyl group, a monovalent fluorinated alkyl group, an unsubstituted monovalent aromatic hydrocarbon group, —OSO$_2$—$R^k$ or —SO$_2$—$R^k$, more preferably a fluorinated alkyl group or an unsubstituted monovalent aromatic hydrocarbon group, and still more preferably a fluorinated alkyl group.

In the formula (r-a): b3 is preferably an integer of 0 to 2, more preferably 0 or 1, and still more preferably 0; and $n_{bb}$ is preferably 0 or 1 and more preferably 0. In the formula (r-b): b4 is preferably an integer of 0 to 2, more preferably 0 or 1, and still more preferably 0; b5 is preferably an integer of 0 to 2, more preferably 0 or 1, and still more preferably 0; $n_{b2}$ is preferably 2 or 3, and more preferably 2; and $n_{b1}$ is preferably 0 or 1, and more preferably 0. In the formula (r-c), b6 and b7 are each preferably an integer of 0 to 2, more preferably 0 or 1, and still more preferably 0.

$Z^+$ represents preferably the cation (r-a) or the cation (r-c), and more preferably a triphenylsulfonium cation or a diphenyliodonium cation.

In the case in which the acid generator (B) is in the form incorporated as a part of the polymetalloxane (A), for example, a structure obtained by substituting at least one hydrogen atom included in the organic group which may be represented by $R^{11}$, $R^{12}$ or $R^{13}$ in the above formula (4) with M (a germanium atom, a tin atom or a lead atom) in the polymetalloxane (A) (i.e., being equivalent to the structure, wherein $R^1$ in the above formula (1) or $R^2$ in the above formula (2) is $R^{11}R^{12}R^{13}C$— in the above formula (4)), a structure obtained by substituting at least one hydrogen atom included in the monovalent radiation-sensitive onium cation represented by $Z^+$ in the above formula (4) with M in the polymetalloxane (A), and the like are involved.

Examples of the acid generating agent (B) include compounds represented by the following formulae (i-1) to (i-11) (hereinafter, may be also referred to as "compounds (i-1) to (i-11)"), and the like.

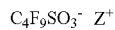
(i-1)

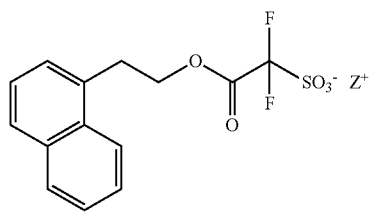
(i-2)

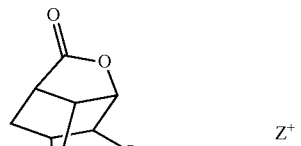
(i-3)

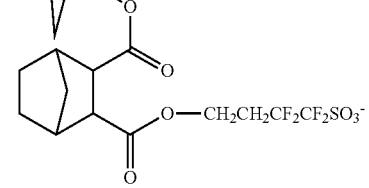
(i-4)

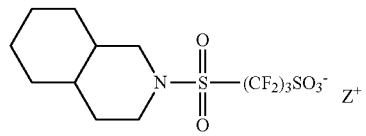
(i-5)

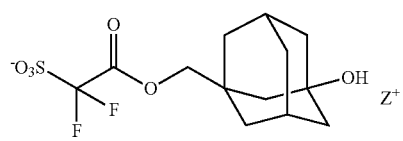
(i-6)

$CH_3(CH_2)_7SO_3^-$ $Z^+$
(i-7)

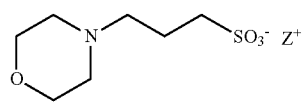
(i-8)

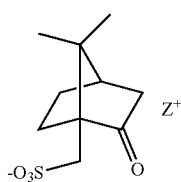
(i-9)

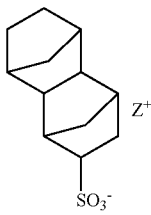
(i-10)

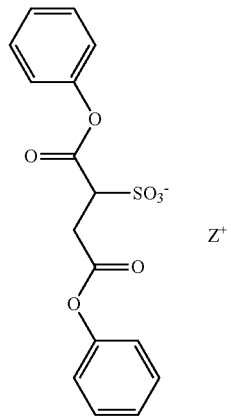
(i-11)

In the above formulae (i-1) to (i-11), $Z^+$ is as defined in the above formula (4).

The acid generating agent (B) is preferably the compound (i-1) or the compound (i-11).

The lower limit of the content of the acid generating agent (B) with respect to 100 parts by mass of the polymetalloxane (A) is preferably 1 part by mass, more preferably 3 parts by mass, still more preferably 5 parts by mass, particularly preferably 8 parts by mass, further particularly preferably 12 parts by mass, and most particularly preferably 15 parts by mass. The upper limit of the content of the acid generating agent (B) is preferably 50 parts by mass, more preferably 30 parts by mass, still more preferably 25 parts by mass, and particularly preferably 20 parts by mass. When the content of the acid generating agent (B) falls within the above range, the sensitivity and resolution of the radiation-sensitive composition can be further improved. The radiation-sensitive composition may contain two or more types of the acid generator (B).

(C) Solvent

The solvent (C) is not particularly limited as long as it is a solvent capable of dissolving or dispersing at least the polymetalloxane (A) and the acid generator (B), as well as optional component(s) such as the acid trapper (D) which may be contained as needed.

The solvent (C) is exemplified by an alcohol solvent, an ether solvent, a ketone solvent, an amide solvent, an ester solvent, a hydrocarbon solvent, and the like.

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as propylene glycol;
polyhydric alcohol partially etherated solvents having 3 to 19 carbon atoms such as propylene glycol monomethyl ether; and the like.

Examples of the ether solvent include:

dialkyl ether solvents having 4 to 14 carbon atoms such as diethyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents having 3 to 12 carbon atoms such as acetone, methyl ethyl ketone, methyl-iso-butyl ketone, and 2-heptanone;

cyclic ketone solvents such as cyclopentanone, cyclohexanone, cycloheptanone, cyclooctanone and methylcyclohexanone;

2,4-pentanedione, acetonyl acetone, acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents, e.g., acetic acid ester solvents such as n-butyl acetate and amyl acetate, propionic acid ester solvents such as ethyl propionate, and the like;

hydroxycarboxylic acid ester solvents such as ethyl lactate and n-butyl glycolate;

polyhydric alcohol carboxylate solvents such as propylene glycol acetate;

polyhydric alcohol partial ether carboxylate solvents such as propylene glycol monomethyl ether acetate;

polyhydric carboxylic acid diester solvents such as diethyl oxalate;

lactone solvents such as γ-butyrolactone and δ-valerolactone;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

The solvent (C) is preferably the alcohol solvent, more preferably the aliphatic monohydric alcohol solvent, and still more preferably 4-methyl-2-pentanol. The radiation-sensitive resin composition may contain two or more types of the solvent (C).

Alternatively, the solvent (C) may be a mixed solvent containing the organic solvent as a principal component, and a small amount of water. The solvent (C) being such a mixed solvent enables the polymetalloxane (A) to be hydrated, and as a result, the storage stability of the radiation-sensitive composition can be further improved. In addition, an increase in the molecular weight of the polymetalloxane (A) can be further promoted in resist pattern formation.

The lower limit of the content of water in the mixed solvent is preferably 0.01% by mass, more preferably 0.1% by mass, and still more preferably 1% by mass. The upper limit of the content is preferably 20% by mass, and more preferably 10% by mass.

(D) Acid Trapper

The acid trapper (D) traps an acid generated from the acid generator (B) by an exposure and controls a diffusion phenomenon of the acid in the resist film, thereby allowing an effect of inhibiting an undesired chemical reaction in unexposed regions to be achieved. The acid trapper (D) may be contained in the radiation-sensitive composition in the form of a low-molecular weight compound (hereinafter, may be also referred to as "(D) acid trapping agent" or "acid trapping agent (D)" as appropriate), in the form incorporated as a part of the polymetalloxane (A), or in both of these forms.

The acid trapping agent (D) is exemplified by a nitrogen-containing to compound, a photodegradable base that is photosensitized by an exposure to generate a weak acid, and the like. The photodegradable base is degraded through the exposure, leading to a decrease in an acid-trapping property.

The nitrogen-containing compound is exemplified by an amine compound, an amide group-containing compound, a urea compound, a nitrogen-containing heterocyclic compound, and the like.

Examples of the amine compound include: compounds each having one amino group such as monoalkylamine, dialkylamine, trialkylamine and aromatic amine; compounds each having two amino groups; compounds each having three or more amino groups; and the like.

Examples of the nitrogen-containing heterocyclic compound include imidazoles, pyridines, morpholines, pyrazine, pyrazole, and the like.

As the nitrogen-containing compound, a compound having an acid-labile group may be also used. Examples of such a nitrogen-containing compound having an acid-labile group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

The photodegradable base is exemplified by a radiation-sensitive onium cation salt of a carboxylic acid, and the like. Examples of such a compound include a sulfonium salt represented by the following formula (5-1), an iodonium salt represented by the following formula (5-2), and the like.

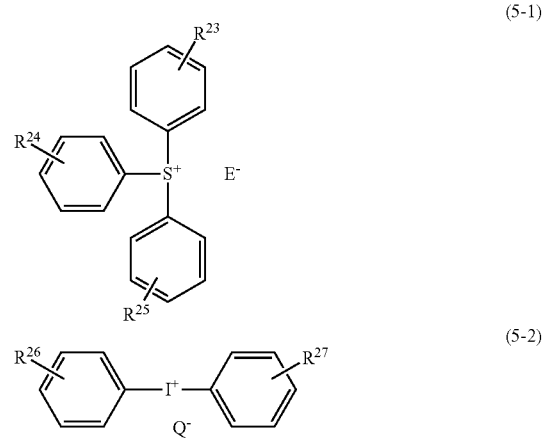

In the above formulae (5-1) and (5-2), $R^{23}$ to $R^{27}$ each independently represent a hydrogen atom, an alkyl group, an alkoxy group, a hydroxy group or a halogen atom; and $E^-$ and $Q^-$ each independently represent $R^\beta$—$COO^-$ or an anion represented by the following formula (5-3), wherein $R^β$ represents a monovalent hydrocarbon group having 1 to 20 carbon atoms.

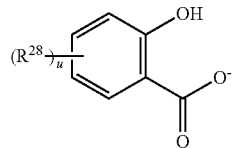

(5-3)

In the above formula (5-3), $R^{28}$ represents a linear or branched alkyl group having 1 to 12 carbon atoms, a linear or branched fluorinated alkyl group having 1 to 12 carbon atoms or a linear or branched alkoxy group having 1 to 12 carbon atoms; and u is an integer of 0 to 2, wherein in a case in which u is 2, two $R^{28}$s are identical or different.

The photodegradable base is preferably the sulfonium salt, more preferably a triarylsulfonium salt, and still more preferably triphenylsulfonium salicylate.

In a case in which the radiation-sensitive composition contains the acid trapping agent (D), the lower limit of the content of the acid trapping agent (D) with respect to 100 parts by mass of the polymetalloxane (A) is preferably 0.1 parts by mass, more preferably 0.5 parts by mass, still more preferably 1 part by mass, and particularly preferably 3 parts by mass. The upper limit of the content of the acid trapping agent (D) is preferably 20 parts by mass, more preferably 15 parts by mass, still more preferably 10 parts by mass, and particularly preferably 7 parts by mass. When the content of the acid trapping agent (D) falls within the above range, the sensitivity and resolution of the radiation-sensitive composition can be further improved. One, or two or more types of the acid trapper (D) may be used.

Other Optional Component

The radiation-sensitive composition may also contain other optional component(s) in addition to the components (A) to (D). The other optional component is exemplified by a surfactant, a sensitizing agent, a fluorine atom-containing polymer, and the like. In a case in which the radiation-sensitive composition contains the other optional component, the lower limit of the content of the other optional component with respect to 100 parts by mass of the polymetalloxane (A) is preferably 0.1 parts by mass, and more preferably 0.5 parts by mass. The upper limit of the content of the other optional component is preferably 10 parts by mass, and more preferably 5 parts by mass. One, or two or more types of the other optional component may be used.

Preparation of Radiation-Sensitive Composition

The radiation-sensitive composition may be prepared by, for example, mixing at a predetermined ratio the polymetalloxane (A), the acid generator (B), the solvent (C), and as needed the optional component such as the acid trapper (D), and preferably filtering a thus resulting mixture through a filter having a pore size of about 0.2 μm. The lower limit of the solid content concentration of the radiation-sensitive composition is preferably 0.1% by mass, more preferably 0.5% by mass, still more preferably 1% by mass, and particularly preferably 2% by mass. The upper limit of the solid content concentration is preferably 50% by mass, more preferably 30% by mass, still more preferably 10% by mass, and particularly preferably 5% by mass.

Resist Pattern-Forming Method

The resist pattern-forming method of the other embodiment of the present invention includes the steps of: applying the radiation-sensitive composition of the one embodiment of the present invention directly or indirectly on at least an upper face side of a substrate to form a resist film (hereinafter, may be also referred to as "applying step"); exposing the resist film (hereinafter, may be also referred to as "exposing step"); and developing the resist film exposed (hereinafter, may be also referred to as "developing step").

The resist pattern-forming method enables a resist pattern with superior sensitivity and superior resolution to be formed since the radiation-sensitive composition described above is used. Hereinafter, each step will be described.

Applying Step

In this step, the radiation-sensitive composition of the one embodiment of the present invention is applied directly or indirectly on at least an upper face side of a substrate. Specifically, the radiation-sensitive composition is applied such that a coating film thus obtained has a desired thickness, and thereafter evaporation of a solvent and the like in the radiation-sensitive composition is allowed by prebaking (PB) as needed, thereby forming a resist film. The applying procedure may be, for example, spin-coating, flow casting coating, roll coating, or the like. The substrate may be, for example, a silicon wafer, a wafer covered with aluminum, and the like. It is to be noted that in order to maximize potential abilities of the radiation-sensitive composition, an organic or inorganic antireflective film may be formed on the substrate.

The lower limit of the average thickness of the resist film to be formed is preferably 1 nm, more preferably 5 nm, still more preferably 10 nm, and particularly preferably 20 nm. On the other hand, the upper limit of the average thickness is preferably 1,000 nm, more preferably 200 nm, still more preferably 100 nm, and particularly preferably 70 nm.

The lower limit of a temperature for the PB is preferably 60° C., and more preferably 80° C. The upper limit of the temperature for the PB is preferably 140° C., and more preferably 120° C. The lower limit of a time period for the PB is preferably 5 sec, and more preferably 10 sec. The upper limit of the time period for the PB is preferably 600 sec, and more preferably 300 sec.

In this step, in order to preclude influences from basic impurities and the like included in the environmental atmosphere, for example, a protective film may be provided on the resist film formed. Also, in a case in which liquid immersion lithography is carried out in the exposing step as described later, a protective film for liquid immersion may be provided on the resist film formed in order to avoid direct contact between the film and a liquid immersion medium.

Exposing Step

In this step, the resist film formed by the applying step is exposed. Specifically, the film is irradiated with a radioactive ray through a mask having a predetermined pattern, for example. In this step, as needed, irradiation with a radioactive ray via a liquid immersion medium such as water, i.e., liquid immersion lithography, may be adopted. The radioactive ray for use in the exposure is exemplified by: an electromagnetic wave such as a visible light ray, an ultraviolet ray, a far ultraviolet ray, an EUV ray (wavelength: 13.5 nm), an X-ray or a γ-ray; a charged particle ray such as an electron beam or an α-ray; or the like. Of these, the EUV ray and the electron beam are preferred.

It is preferred that post exposure baking (PEB) is conducted after the exposure. The lower limit of the temperature for the PEB is preferably 50° C., and more preferably 80° C. The upper limit of the temperature for the PEB is preferably 200° C., and more preferably 180° C. The lower limit of the time period for the PEB is preferably 5 sec, and more preferably 10 sec. The upper limit of the time period for the PEB is preferably 600 sec, and more preferably 300 sec.

Developing Step

In this step, the resist film exposed is developed by a conventionally well-known procedure. Accordingly, a predetermined resist pattern is formed. The developer solution is exemplified by an aqueous alkali solution, an organic solvent-containing liquid, and the like. The developer solution is preferably the organic solvent-containing liquid in light of developability and the like.

Examples of the organic solvent in the organic solvent-containing liquid include organic solvents similar to those exemplified as the solvent (C) for the radiation-sensitive composition, and the like. Of these, the ketone solvents and the ester solvents are preferred, and 2-heptanone and butyl acetate are more preferred.

The lower limit of the content of the organic solvent in the organic solvent-containing liquid is preferably 80% by mass, more preferably 90% by mass, still more preferably 95% by mass, and particularly preferably 99% by mass. When the content of the organic solvent falls within the above range, a contrast of rates of dissolution in the developer solution between a light-exposed region and a light-unexposed region can be further improved. It is to be noted that a component of the organic solvent-containing liquid other than the organic solvent may be, for example, water, silicone oil, or the like.

Into the developer solution, a surfactant may be added in an appropriate amount, if necessary. As the surfactant, for example, an ionic or nonionic fluorochemical surfactant, a silicone-based surfactant or the like may be used.

The resist pattern obtained after the development is preferably rinsed with a rinse agent such as water or an alcohol, and then dried.

EXAMPLES

Hereinafter, the present invention is explained in detail by way of Examples, but the present invention is not in any way limited to these Examples. Each physical property value was measured according to the following method.

Solid Content Concentration of Liquid Containing Polymetalloxane (A)

The solid content concentration of a liquid containing the polymetalloxane (A) was calculated from a mass (M1) of the liquid containing the polymetalloxane (A) and a mass (M2) determined after drying of the liquid, according to a formula of: M2×100/M1 (% by mass).

Synthesis of Polymetalloxane (A)

Synthesis Example 1

Phenylgermanium trichloride in an amount of 2.0 g was dissolved in 50 g of tetrahydrofuran, and 1.0 g of water was added thereto. The mixture was stirred at room temperature for 48 hrs. After 40 g of 4-methyl-2-pentanol was added thereto, the mixture was concentrated under reduced pressure by a rotary evaporator, and then the concentrated liquid was filtered through a PTFE membrane filter having a pore size of 0.20 μm to give a liquid containing a polymetalloxane (A-1). This liquid had a solid content concentration of 4.0% by mass.

Synthesis Example 2

Benzylgermanium trichloride in an amount of 2.0 g was dissolved in 50 g of tetrahydrofuran, and 1.0 g of water was added thereto. The mixture was stirred at room temperature for 48 hrs. After 40 g of 4-methyl-2-pentanol was added thereto, the mixture was concentrated under reduced pressure by a rotary evaporator, and then the concentrated liquid was filtered through a PTFE membrane filter having a pore size of 0.20 μm to give a liquid containing a polymetalloxane (A-2). This liquid had a solid content concentration of 4.3% by mass.

Synthesis Example 3

Phenyltin trichloride in an amount of 2.0 g was dissolved in 50 g of tetrahydrofuran, and 1.0 g of water was added thereto. The mixture was stirred at room temperature for 48 hrs. After 40 g of 4-methyl-2-pentanol was added thereto, the mixture was concentrated under reduced pressure by a rotary evaporator, and then the concentrated liquid was filtered through a PTFE membrane filter having a pore size of 0.20 μm to give a liquid containing a polymetalloxane (A-3). This liquid had a solid content concentration of 3.5% by mass.

Synthesis Example 4

4-Methoxyphenyltri(phenylethynyl)tin in an amount of 1.0 g was dissolved in 25 g of tetrahydrofuran and 25 g of chloroform, and 3.0 g of water was added thereto. The mixture was stirred at room temperature for 96 hrs. After 40 g of 4-methyl-2-pentanol was added thereto, the mixture was concentrated under reduced pressure by a rotary evaporator, and then the concentrated liquid was filtered through a PTFE membrane filter having a pore size of 0.20 μm to give a liquid containing a polymetalloxane (A-4). This liquid had a solid content concentration of 2.5% by mass.

Synthesis Example 5

Isopropyltin trichloride in an amount of 2.0 g was dissolved in 50 g of tetrahydrofuran, and 1.0 g of water was added thereto. The mixture was stirred at room temperature for 48 hrs. After 40 g of 4-methyl-2-pentanol was added thereto, the mixture was concentrated under reduced pressure by a rotary evaporator, and then the concentrated liquid was filtered through a PTFE membrane filter having a pore size of 0.20 μm to give a liquid containing a polymetalloxane (A-5). This liquid had a solid content concentration of 4.0% by mass.

Synthesis Example 6

Diphenyldichlorolead in an amount of 2.0 g was dissolved in 50 g of tetrahydrofuran, and 5.0 g of water was added thereto. The mixture was stirred at 40° C. for 12 hrs. After 40 g of 4-methyl-2-pentanol was added thereto, the mixture was concentrated under reduced pressure by a rotary evaporator, and then the concentrated liquid was filtered through a PTFE membrane filter having a pore size of 0.20 μm to give a liquid containing a polymetalloxane (A-6). This liquid had a solid content concentration of 5.0% by mass.

Preparation of Radiation-Sensitive Composition

The acid generating agent (B), the solvent (C) and the acid trapping agent (D) used for preparing the radiation-sensitive compositions are presented below.

(B) Acid Generating Agent

B-1: diphenyliodonium nonafluorobutanesulfonate (a compound represented by the following formula (B-1))

B-2: triphenylsulfonium 1,2-di(cyclohexyloxycarbonyl)ethane-1-sulfonate (a compound represented by the following formula (B-2))

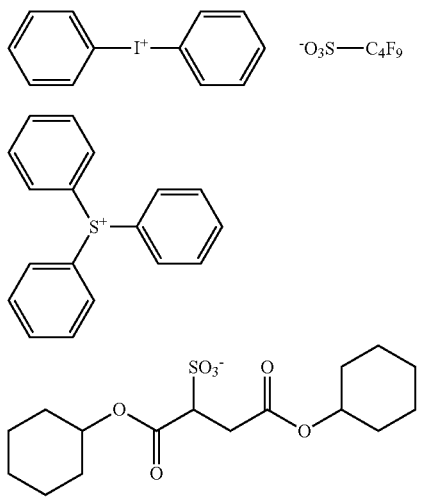

(C) Solvent
C-1: 4-methyl-2-pentanol
(D) Acid Trapping Agent
D-1: triphenylsulfonium salicylate (a compound represented by the following formula (D-1))
D-2: 2,4,5-triphenylimidazole (a compound represented by the following formula (D-2))

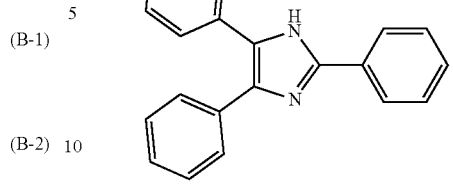

Example 1

After mixing 2,500 parts by mass of a liquid (containing 100 parts by mass of (A-1) in terms of the solid content) containing (A-1) as the polymetalloxane (A) with 10 parts by mass of (B-1) as the acid generating agent (B), the mixture was diluted with 1,890 parts by mass of (C-1) as the solvent (C) to prepare a liquid having a solid content concentration of 2.5% by mass. The liquid was filtered through a membrane filter having a pore size of 0.20 μm to give a radiation-sensitive composition (R-1).

Examples 2 to 6 and Comparative Examples 1 to 8

Each component of the type and the content shown in Table 2 below (the content of the polymetalloxane (A) being indicated as "parts by mass" of the liquid containing the polymetalloxane) was mixed, and the mixture was diluted with (C-1) as the solvent (C) to prepare a liquid having a solid content concentration of 2.5% by mass. The liquid thus obtained was filtered through a membrane filter having a pore size of 0.20 μm to give radiation-sensitive compositions (R-2) to (R-14). In Table 1 below, "-" denotes that a corresponding component was not used.

TABLE 1

| | Radiation-sensitive composition | (A) Polymetalloxane | | (B) Acid generating agent | | (C) Solvent | | (D) Acid trapping agent | |
|---|---|---|---|---|---|---|---|---|---|
| | | type | content (parts by mass) | type | content (parts by mass) | type | content (parts by mass) | type | content (parts by mass) |
| Example 1 | R-1 | A-1 | 2500 | B-1 | 10 | C-1 | 1890 | — | — |
| Comparative Example 1 | R-2 | A-1 | 2500 | — | — | C-1 | 1500 | — | — |
| Comparative Example 2 | R-3 | A-2 | 2500 | B-1 | 10 | C-1 | 2190 | — | — |
| Comparative Example 3 | R-4 | A-2 | 2500 | — | — | C-1 | 1800 | — | — |
| Example 2 | R-5 | A-3 | 2500 | B-2 | 20 | C-1 | 1780 | — | — |
| Example 3 | R-6 | A-3 | 2500 | B-2 | 20 | C-1 | 1975 | D-1 | 5 |
| Example 4 | R-7 | A-3 | 2500 | B-2 | 20 | C-1 | 1975 | D-2 | 5 |
| Comparative Example 4 | R-8 | A-3 | 2500 | — | — | C-1 | 1000 | — | — |
| Example 5 | R-9 | A-4 | 2500 | B-1 | 15 | C-1 | 585 | — | — |

TABLE 1-continued

| Radiation-sensitive composition | (A) Polymetalloxane type | (A) Polymetalloxane content (parts by mass) | (B) Acid generating agent type | (B) Acid generating agent content (parts by mass) | (C) Solvent type | (C) Solvent content (parts by mass) | (D) Acid trapping agent type | (D) Acid trapping agent content (parts by mass) |
|---|---|---|---|---|---|---|---|---|
| Comparative Example 5 | R-10 | A-4 | 2500 | — | — | C-1 | 0 | — | — |
| Comparative Example 6 | R-11 | A-5 | 2500 | B-1 | 15 | C-1 | 2085 | — | — |
| Comparative Example 7 | R-12 | A-5 | 2500 | — | — | C-1 | 1500 | — | — |
| Example 6 | R-13 | A-6 | 2500 | B-2 | 10 | C-1 | 2890 | — | — |
| Comparative Example 8 | R-14 | A-6 | 2500 | — | — | C-1 | 2500 | — | — |

Formation of Resist Pattern

After each radiation-sensitive composition prepared as described above was spin-coated on a silicon wafer, PB was conducted under a condition of 100° C. and 60 sec to form a resist film having an average thickness of 50 nm. Next, this resist film was exposed through a mask by using a vacuum ultraviolet light exposure system (NA: 0.3, diepole illumination, wavelength: 13.5 nm). Thereafter, PEB was conducted under a condition of 170° C. and 120 sec. Subsequently, development was carried out with a puddle method using 2-heptanone at 23° C. for 1 min to execute patterning. Thereafter, drying was carried out and a negative-tone resist pattern was formed.

Evaluations

The radiation-sensitive compositions prepared as described above, and the resist patterns formed as described above were evaluated on the following items according to methods described below. The results of the evaluations are shown in Table 2 below.

Sensitivity

By way of patterning with a vacuum ultraviolet ray (wavelength: 13.5 nm), an optimum exposure dose was determined as an exposure dose at which a line-and-space pattern (1L 1S) that included line portions having line widths of 30 nm and space portions of 30 nm that were intervals formed by adjacent line portions was formed to give 1:1 line widths, and this optimum exposure dose was defined as sensitivity (mJ/cm$^2$). The sensitivity was evaluated to be: "AAA (extremely favorable)" in a case of the sensitivity being no greater than 20 mJ/cm$^2$; "AA (very favorable)" in a case of the sensitivity being greater than 20 mJ/cm$^2$ and no greater than 25 mJ/cm$^2$; "A (favorable)" in a case of the sensitivity being greater than 25 mJ/cm$^2$ and no greater than 30 mJ/cm$^2$; and "B (unfavorable)" in a case of the sensitivity being greater than 30 mJ/cm$^2$.

Resolution

In the formation of the resist pattern described above, the resolution was evaluated to be: "AA (very favorable)" in a case of being able to form a line-and-space pattern (1L 1 S) that included line portions having line widths of 22 nm and space portions of 22 nm that were intervals formed by adjacent line portions to give 1:1 line widths; "A (favorable)" in a case of difficulty in resolving for 22 nm, but being able to form a 25 nm line-and-space pattern (1L 1S) to give a 1:1 line width; and "B (unfavorable)" in a case of difficulty in forming the 25 nm line-and-space pattern (1L 1 S) to give 1:1 line widths.

TABLE 2

| | Radiation-sensitive composition | Sensitivity | Resolution |
|---|---|---|---|
| Example 1 | R-1 | A | A |
| Comparative Example 1 | R-2 | B | A |
| Comparative Example 2 | R-3 | B | A |
| Comparative Example 3 | R-4 | B | A |
| Example 2 | R-5 | AA | A |
| Example 3 | R-6 | AA | AA |
| Example 4 | R-7 | A | AA |
| Comparative Example 4 | R-8 | B | A |
| Example 5 | R-9 | AAA | A |
| Comparative Example 5 | R-10 | B | A |
| Comparative Example 6 | R-11 | B | B |
| Comparative Example 7 | R-12 | B | A |
| Example 6 | R-13 | A | A |
| Comparative Example 8 | R-14 | B | A |

As is clear from the results shown in Table 2, the radiation-sensitive compositions of the Examples were superior in the sensitivity and the resolution. The radiation-sensitive compositions of the Comparative Examples were inferior in the sensitivity, the resolution or both characteristics.

According to the radiation-sensitive resin composition and the resist pattern-forming method of the embodiments of the present invention, formation of a resist pattern is enabled with superior sensitivity and superior resolution. Therefore, these can be suitably used for the manufacture of semiconductor devices, for which further progress of microfabrication is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive composition, comprising:
a solvent;
a radiation-sensitive acid generator; and
a polymetalloxane comprising a structural unit of formula (1),

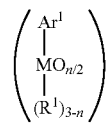

(1)

wherein M is a tin atom or a lead atom, Ar$^1$ is a substituted or unsubstituted aryl group having 6 to 20 ring atoms, or a substituted or unsubstituted heteroaryl group having 5 to 20 ring atoms, R$^1$ is a monovalent organic group having 1 to 20 carbon atoms, a hydrogen atom, a halogen atom or a hydroxy group, n is 2 or 3, and a lower limit of a content of the polymetalloxane comprising the structural unit of formula (1) is 50% by mass with respect to a total solid content in the radiation-sensitive composition.

2. The radiation-sensitive composition according to claim 1, wherein a substituent of the substituted aryl group or the substituted heteroaryl group of Ar$^1$ is an electron donating group.

3. The radiation-sensitive composition according to claim 2, wherein the electron donating group is a hydroxy group, an alkoxy group, an amino group, a cycloalkyloxy group, an alkyl group, or a cycloalkyl group.

4. The radiation-sensitive composition according to claim 1, wherein a proportion of the structural unit of formula (1) in the polymetalloxane is in a range of from 5 mol % to 100 mol % with respect to total structural units in the polymetalloxane.

5. The radiation-sensitive composition according to claim 1, further comprising:
an acid trapper.

6. A resist pattern-forming method, comprising:
applying the radiation-sensitive composition of claim 1 directly or indirectly on at least one face side of a substrate to form a resist film;
exposing the resist film to an extreme ultraviolet ray or electron beam; and
developing with an organic solvent-containing liquid the resist film exposed.

7. The resist pattern-forming method according to claim 6, wherein a substituent of the substituted aryl group or the substituted heteroaryl group of Ar$^1$ is an electron donating group.

8. The resist pattern-forming method according to claim 7, wherein the electron donating group is a hydroxy group, an alkoxy group, an amino group, a cycloalkyloxy group, an alkyl group, or a cycloalkyl group.

9. The resist pattern-forming method according to claim 6, wherein a proportion of the structural unit of formula (1) in the polymetalloxane is in a range of from 5 mol % to 100 mol % with respect to total structural units in the polymetalloxane.

10. The resist pattern-forming method according to claim 6, wherein the radiation-sensitive composition further comprises an acid trapper.

11. The radiation-sensitive composition according to claim 1, wherein the content of the polymetalloxane comprising the structural unit of formula (1) is in a range of 50% by mass to 95% by mass with respect to the total solid content in the radiation-sensitive composition.

12. The radiation-sensitive composition according to claim 11, wherein the proportion of the structural unit of formula (1) in the polymetalloxane is in a range of from 20 mol % to 99 mol % with respect to the total structural units in the polymetalloxane.

13. The radiation-sensitive composition according to claim 11, wherein the proportion of the structural unit of formula (1) in the polymetalloxane is in a range of from 50 mol % to 95 mol % with respect to the total structural units in the polymetalloxane.

14. The radiation-sensitive composition according to claim 11, wherein the proportion of the structural unit of formula (1) in the polymetalloxane is in a range of from 75 mol % to 90 mol % with respect to the total structural units in the polymetalloxane.

15. The radiation-sensitive composition according to claim 1, wherein the content of the polymetalloxane comprising the structural unit of formula (1) is in a range of 70% by mass to 95% by mass with respect to the total solid content in the radiation-sensitive composition.

16. The radiation-sensitive composition according to claim 1, wherein the content of the polymetalloxane comprising the structural unit of formula (1) is in a range of 80% by mass to 95% by mass with respect to the total solid content in the radiation-sensitive composition.

17. The radiation-sensitive composition according to claim 1, wherein the content of the polymetalloxane comprising the structural unit of formula (1) is in a range of 85% by mass to 95% by mass with respect to the total solid content in the radiation-sensitive composition.

18. The radiation-sensitive composition according to claim 1, wherein the proportion of the structural unit of formula (1) in the polymetalloxane is in a range of from 20 mol % to 99 mol % with respect to the total structural units in the polymetalloxane.

19. The radiation-sensitive composition according to claim 1, wherein the proportion of the structural unit of formula (1) in the polymetalloxane is in a range of from 50 mol % to 95 mol % with respect to the total structural units in the polymetalloxane.

20. The radiation-sensitive composition according to claim 1, wherein the proportion of the structural unit of formula (1) in the polymetalloxane is in a range of from 75 mol % to 90 mol % with respect to the total structural units in the polymetalloxane.

* * * * *